United States Patent
Lin et al.

(10) Patent No.: US 10,269,289 B2
(45) Date of Patent: Apr. 23, 2019

(54) SHIFT REGISTER AND CONTROL METHOD THEREOF

(71) Applicant: AU OPTRONICS CORP., Hsinchu (TW)

(72) Inventors: Wei-Li Lin, Hsin-Chu (TW); Che-Wei Tung, Hsin-Chu (TW); Yan-Ting Chen, Hsin-Chu (TW)

(73) Assignee: AU OPTRONICS CORP., Hsinchu (TW)

( * ) Notice: Subject to any disclaimer, the term of this patent is extended or adjusted under 35 U.S.C. 154(b) by 224 days.

(21) Appl. No.: 15/375,575

(22) Filed: Dec. 12, 2016

(65) Prior Publication Data

US 2017/0186361 A1    Jun. 29, 2017

(30) Foreign Application Priority Data

Dec. 23, 2015   (TW) .............................. 104143431 A

(51) Int. Cl.
| | | |
|---|---|---|
| G11C 19/00 | (2006.01) | |
| G09G 3/20 | (2006.01) | |
| G11C 19/18 | (2006.01) | |
| G11C 19/28 | (2006.01) | |
| G09G 3/36 | (2006.01) | |

(52) U.S. Cl.
CPC .......... *G09G 3/2092* (2013.01); *G11C 19/184* (2013.01); *G11C 19/28* (2013.01); *G09G 3/3677* (2013.01); *G09G 2300/0408* (2013.01); *G09G 2300/0465* (2013.01); *G09G 2300/0842* (2013.01); *G09G 2310/0202* (2013.01); *G09G 2310/0267* (2013.01); *G09G 2310/0286* (2013.01)

(58) Field of Classification Search
None
See application file for complete search history.

(56) References Cited

U.S. PATENT DOCUMENTS

| | | | |
|---|---|---|---|
| 7,561,656 B2 | 7/2009 | Chang et al. | |
| 8,031,827 B2 * | 10/2011 | Tsai ...................... | G11C 19/28 377/64 |
| 2009/0303211 A1 | 12/2009 | Hu | |

(Continued)

FOREIGN PATENT DOCUMENTS

| | | |
|---|---|---|
| CN | 103985363 | 8/2014 |
| CN | 104167192 | 11/2014 |

*Primary Examiner* — Tuan T Lam
(74) *Attorney, Agent, or Firm* — WPAT, PC

(57) ABSTRACT

A shift register includes a control circuit, a switching circuit, a driving circuit, and a pull-down circuit. The control circuit is configured to output a control signal having a high level during a pull-up period and a voltage-regulating period respectively. The switching circuit is configured to provide a control voltage according to the control signal and a front stage signal outputted by a front x-stage shift register during the pull-up period. The driving circuit is configured to generate a driving signal according to the control voltage provided by the switching circuit, and output a home stage scan signal based on the driving signal. The pull-down circuit is configured to pull down a voltage level of the driving signal according to a scan signal outputted by a rear y-stage shift register during a pull-down period. The switching circuit is configured to regulate the driving signal and the home stage scan signal.

20 Claims, 8 Drawing Sheets

(56) References Cited

U.S. PATENT DOCUMENTS

| | | | | |
|---|---|---|---|---|
| 2015/0049853 A1* | 2/2015 | Lin | ................ | G11C 19/28 |
| | | | | 377/64 |
| 2015/0191090 A1* | 7/2015 | Sawa | ................ | B60L 1/003 |
| | | | | 701/19 |
| 2015/0255014 A1* | 9/2015 | Lin | ................ | G11C 19/28 |
| | | | | 345/84 |
| 2015/0255034 A1* | 9/2015 | Hong | ................ | G09G 3/3674 |
| | | | | 345/214 |
| 2015/0288364 A1* | 10/2015 | Lin | ................ | H03K 19/00384 |
| | | | | 377/75 |
| 2015/0318051 A1* | 11/2015 | Hong | ................ | G11C 19/28 |
| | | | | 377/68 |
| 2016/0019828 A1* | 1/2016 | Lin | ................ | G09G 3/20 |
| | | | | 345/214 |
| 2016/0275853 A1* | 9/2016 | Lin | ................ | G09G 3/2096 |
| 2018/0090097 A1* | 3/2018 | Tung | ................ | G09G 5/003 |

* cited by examiner

SHIFT REGISTER AND CONTROL METHOD THEREOF

RELATED APPLICATIONS

This application claims priority to Taiwan Application Serial Number 104143431, filed Dec. 23, 2015, which is herein incorporated by reference.

BACKGROUND

Field of Invention

The present invention relates to a driving circuit of a display panel, and particularly to a shift register and a control method thereof.

Description of Related Art

Because of the gradually fierce competition in panel industry, it becomes a trend to enable electronic products to be thinner for the present electronic products, thereby satisfying consumers' demands of the electronic products, and the panel industry follows the trend and develops a technology of gate drive on array (GOA) to enable a panel to be thinner. The GOA technology means that gate drivers are disposed on an array substrate to replace driver chips fabricated by external silicon chips. Since the gate drivers can be directly disposed around a panel through the GOA technology, processes for fabricating a display panel are simplified, and thus the integration degree of the display panel is increased to enable the display panel to be thinner.

In shift registers of a GOA circuit, each of the functions of the shift registers needs an independent circuit to conduct functions of the shift registers, so that a large number of circuits are required for the shift registers and result in a greater space required for layout of the whole shift registers, and the greater space is unbeneficial to fabrication of a panel having a thinner size and a panel having a slim boarder.

In view of the foregoing, there exist problems and disadvantages in the existing technology that await further improvement. However, those of ordinary skill in the art have been unable to find solutions to such problems and disadvantages.

SUMMARY

The following presents a simplified summary of the disclosure in order to provide a basic understanding to the reader. This summary is not an extensive overview of the disclosure and it does not identify key/critical elements of the present invention or delineate the scope of the present invention.

One aspect of the present invention is related to a shift register including a control circuit, a switching circuit, a driving circuit, and a pull-down circuit. The control circuit is configured to output a control signal having a high level during a pull-up period and a voltage-regulating period respectively. The switching circuit is configured to provide a control voltage in accordance with the control signal and a front stage signal outputted by a front x-stage shift register during the pull-up period. The driving circuit is configured to generate a driving signal in accordance with the control voltage provided by the switching circuit, and output a home stage scan signal based on the driving signal. The pull-down circuit is configured to pull down a voltage level of the driving signal in accordance with a scan signal outputted by a rear y-stage shift register during a pull-down period. The switching circuit is configured to regulate the driving signal and the home stage scan signal based on the control signal and the front stage signal outputted by the front x-stage shift register during the voltage-regulating signal, in which x and y are positive integers greater than or equal to 1.

In an embodiment, the switching circuit is turned on in accordance with the control signal during the pull-up period, thereby charging the driving circuit by using the front stage signal having a high level to pull up a voltage level of the control voltage.

In another embodiment, the control circuit outputs the control signal having a low level during a driving period, and the switching circuit is turned off in accordance with the control signal, and the driving circuit generates the driving signal in accordance with the control voltage which is pulled up.

In further another embodiment, the driving circuit includes a capacitor and a first switch. The capacitor is configured to store the control voltage to generate the driving signal. The first switch is coupled to the capacitor and turned on in accordance with the driving signal during the driving period, so as to output the home stage scan signal in accordance with a high frequency clock signal.

In still another embodiment, the driving circuit further includes a second switch. The second switch includes a first terminal, a control terminal and a second terminal. The first terminal is configured to receive the high frequency clock signal. The control terminal is coupled to the capacitor and configured to receive the driving signal. The second terminal is configured to output an actuating signal.

In another embodiment, the pull-down circuit is turned on in accordance with the scan signal outputted by the rear y-stage shift register during the pull-down period, thereby grounding the driving circuit to pull down the voltage level of the driving signal.

In further another embodiment, the switching circuit includes a third switch. The third switch includes a first terminal, a control terminal and a second terminal. The first terminal is coupled to a terminal of the capacitor and configured to provide the control voltage. The control terminal is coupled to the control circuit and configured to receive the control signal. The second terminal is configured to receive the front stage signal outputted by the front x-stage shift register.

In still another embodiment, the switching circuit further includes a fourth switch. The fourth switch includes a first terminal, a control terminal and a second terminal. The first terminal is coupled to another terminal of the capacitor and an output terminal of the first switch. The control terminal is coupled to the control circuit and configured to receive the control signal. The second terminal is coupled to a low voltage source.

In further another embodiment, the control circuit includes a pull-up unit. The pull-up unit is configured to output the control signal having a high level in accordance with a front stage high frequency clock signal.

In another embodiment, the control circuit includes a pull-down unit. The pull-down unit is configured to output the control signal having a low level in accordance with a rear stage driving signal of a rear z-stage shift register, wherein z is a positive integer greater than or equal to 1.

In further another embodiment, the front stage signal includes one of a front stage scan signal and a front stage actuating signal.

Another aspect of the present invention is related to a control method of a shift register. The shift register includes a control circuit, a switching circuit, a driving circuit and a pull-down circuit. The switching circuit is coupled between the control circuit and the driving circuit, and the pull-down circuit is coupled to the driving circuit. The control method includes following steps: during a pull-up period, the control circuit outputs a control signal having a high level, and the switching circuit provides a control voltage in accordance with the control signal and a front stage signal outputted by a front x-stage shift register, and the driving circuit generates a driving signal in accordance with the control voltage, and the driving circuit outputs a home stage scan signal having a low level in accordance with the driving signal; during a driving period, the control circuit outputs a control signal having a low level, and the switching circuit is turned off in accordance with the control signal to enable the driving circuit to pull up the driving signal in accordance with the home stage scan signal and to output the home stage scan signal having a high level in accordance with the driving signal; during a pull-down period, the pull-down circuit pulls down a voltage level of the driving signal in accordance with a scan signal outputted by a rear y-stage shift register, and the driving circuit outputs the home stage scan signal having a low level in accordance with the driving signal; and during a voltage-regulating period, the control circuit outputs the control signal having a high level, and the switching circuit regulates the driving signal and the home stage scan signal in accordance with the control signal and the front stage signal outputted by the front x-stage shift register, in which x, y are positive integers greater than or equal to 1.

In another embodiment, during the pull-up period, the step for providing the control voltage by using the switching circuit in accordance with the control signal and the front stage signal outputted by the front x-stage shift register includes: during the pull-up period, charging the driving circuit by using the switching circuit in accordance with the control signal and the front stage signal to pull up a voltage level of the control voltage.

In further another embodiment, during the pull-down period and the voltage-regulating period, the step for outputting the control signal having a high level by using the control circuit includes: during the pull-up period and the voltage-regulating period, outputting the control signal having a high level by using the control circuit in accordance with a front stage high frequency clock signal.

In still another embodiment, during the pull-down period, the step for pulling down the voltage level of the driving signal by using the pull-down circuit in accordance with the scan signal outputted by the rear y-stage shift register includes: during the pull-down period, grounding the driving circuit by using the pull-down circuit in accordance with the scan signal outputted by the rear y-stage shift register to pull down the voltage level of the driving signal.

In another embodiment, during the driving period, pulling up the driving signal by using the driving circuit in accordance with the home stage scan signal.

In another embodiment, during the driving period, the step for outputting the control signal having the low level by using the control circuit includes: during the driving period, outputting the control signal having the low level in accordance with a rear stage driving signal of a rear z-stage shift register, in which z is a positive integer greater than or equal to 1.

In further another embodiment, during the voltage-regulating period, the step for regulating the driving signal and the home stage scan signal by using the switching circuit in accordance with the control signal and the front stage signal outputted by the front x-stage shift register includes: during the voltage-regulating period, the switch circuit is turned on in accordance with the control signal having a high level to regulate the driving signal and the home stage scan signal in accordance with a front stage scan signal having a low level.

Therefore, in accordance with the summary of the present invention, the embodiments of the present invention provides a shift register and a control method thereof to overcome the problem that a greater space is required for layout of the whole shift registers due to the independent circuit required for each of the functions of the shift registers and it is unbeneficial to fabrication of a panel having a thinner size and a panels having a slim boarder.

These and other features, aspects, and advantages of the present invention, as well as the technical means and embodiments employed by the present invention, will become better understood with reference to the following description in connection with the accompanying drawings and appended claims

BRIEF DESCRIPTION OF THE DRAWINGS

The invention can be more fully understood by reading the following detailed description of the embodiment, with reference made to the accompanying drawings as follows.

Figure 1:
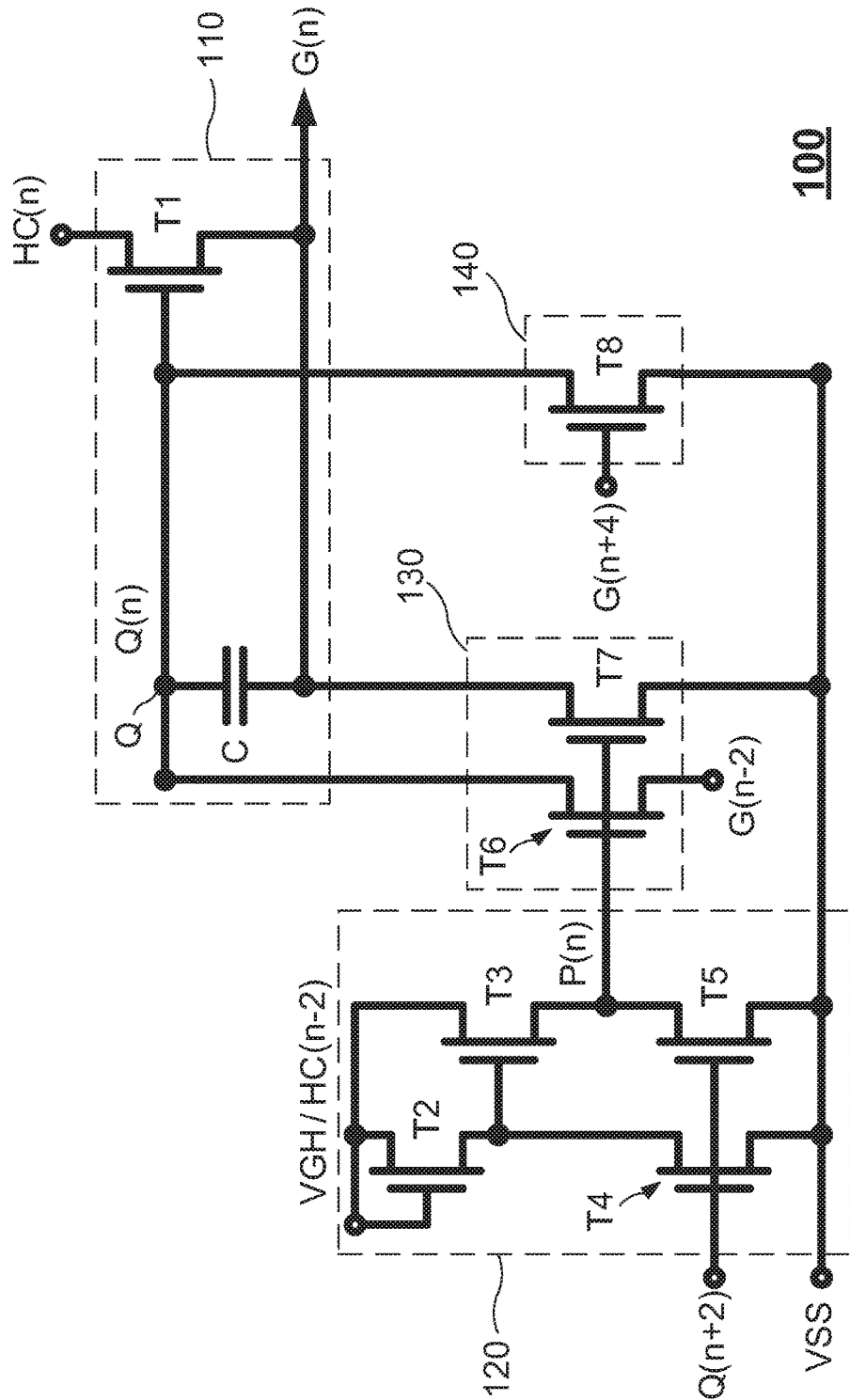
FIG. 1 is a schematic diagram showing a shift register in accordance with embodiments of the present invention.

In accordance with common practice, the various described features/elements are not drawn to scale but instead are drawn to best illustrate specific features/elements relevant to the present invention. Also, wherever possible, like or the same reference numerals are used in the drawings and the description to refer to the same or like parts.

DETAILED DESCRIPTION

The detailed description provided below in connection with the appended drawings is intended as a description of the present examples and is not intended to represent the only forms in which the present example may be constructed or utilized. The description sets forth the functions of the example and the sequence of steps for constructing and operating the example. However, the same or equivalent functions and sequences may be accomplished by different examples.

Unless otherwise defined herein, scientific and technical terminologies employed in the present disclosure shall have the meanings that are commonly understood and used by one of ordinary skill in the art. Unless otherwise required by context, it will be understood that singular terms shall include plural forms of the same and plural terms shall include the singular.

Further, the term "couple" or "connect," as used herein, refers to the direct or indirect physical or electrical contact between or among two or more components, or the mutual operation or action of two or more components.

To overcome the problem that a large number of circuits required to respectively conduct specific functions occupy a great space unbeneficial to fabrication of a panel having a thinner size, the present invention provides a shift register capable of using a single circuit to conduct two functions. Therefore, a number of circuits in the shift register is decreased, thereby overcoming the aforementioned problem. Detail technical means are introduced as below.

FIG. 1 is a schematic diagram showing a shift register in accordance with embodiments of the present invention. As shown in FIG. 1, the shift register 100 includes a driving circuit 110, a control circuit 120, a switching circuit 130 and a pull-down circuit 140. The driving circuit 110 is coupled to the switching circuit 130 and the pull-down circuit 140, and the switching circuit 130 is coupled to the control circuit 120 and the driving circuit 110.

Referring to FIG. 1, in an embodiment, the driving circuit 110 includes a capacitor C and a first switch T1. The capacitor C is coupled to the switching circuit 130. The first switch T1 includes a first terminal, a second terminal and a control terminal. The first terminal is coupled to a high frequency clock signal HC(n), the second terminal is an output terminal configured to output a scan signal G(n), and the control terminal is coupled to a node Q. The capacitor C is coupled between the control terminal and the second terminal of the first switch T1, and thus the first switch T1 can be turned on or turned off in accordance with a control voltage Q(n) on the node Q to determine whether the scan signal G(n) is outputted in accordance with the high frequency clock signal HC(n). The control circuit 120 includes a pull-up unit, such as a circuit constructed by a switch T2 and a switch T3. The pull-up unit is configured to output a control signal P(n) having a high level in accordance with a high frequency clock signal HC(n−2) of a front 2-stage shift register or an input signal VGH. In addition, the control circuit 120 includes a pull-down unit, such as a circuit constructed by a switch T4 and a switch T5. The pull-down unit is configured to output the control signal P(n) having a low level in accordance with a driving signal Q(n+2) of a rear 2-stage shift register. However, the present invention is not limited to the driving signal Q(n+2) of the rear 2-stage shift register. When the present invention is practiced, a rear stage driving signal of a rear z-stage shift register can be used in accordance with actual demands, in which z is a positive integer greater than or equal to 1. The switching circuit 130 includes two switches T6, T7. The switch T6 includes a first terminal, a second terminal and a control terminal. The first terminal is coupled to a terminal (node Q) of the capacitor C, and the second terminal is coupled to a scan signal G(n−2) of a front 2-stage shift register. However, the present invention is not limited to the scan signal G(n−2) of the front 2-stage shift register. When the present invention is practiced, a front stage scan signal outputted by a front x-stage shift register can be used in accordance with actual demands, in which x is a positive integer greater than or equal to 1. In addition, the switch T7 also includes a first terminal, a second terminal and a control terminal. The first terminal of the switch T7 is coupled to another terminal of the capacitor C and the second terminal of the first switch T1, and the second terminal of the switch T7 is configured to receive a low level voltage VSS. The control terminals of the switches T6, T7 are coupled to the control circuit 120 to be controlled by the control signal P(n). The pull-down 140 includes a switch T8 coupled between the node Q and the low level voltage VSS, and the pull-down 140 is turned on or turned off in accordance with a scan signal G(n+4) of a rear 4-stage shift register. However, the present invention is not limited to the scan signal G(n+4) of the rear 4-stage shift register. When the present invention is practiced, a rear stage scan signal outputted by a rear y-stage shift register can be used in accordance with actual demands, in which y is a positive integer greater than or equal to 1.

Figure 2:
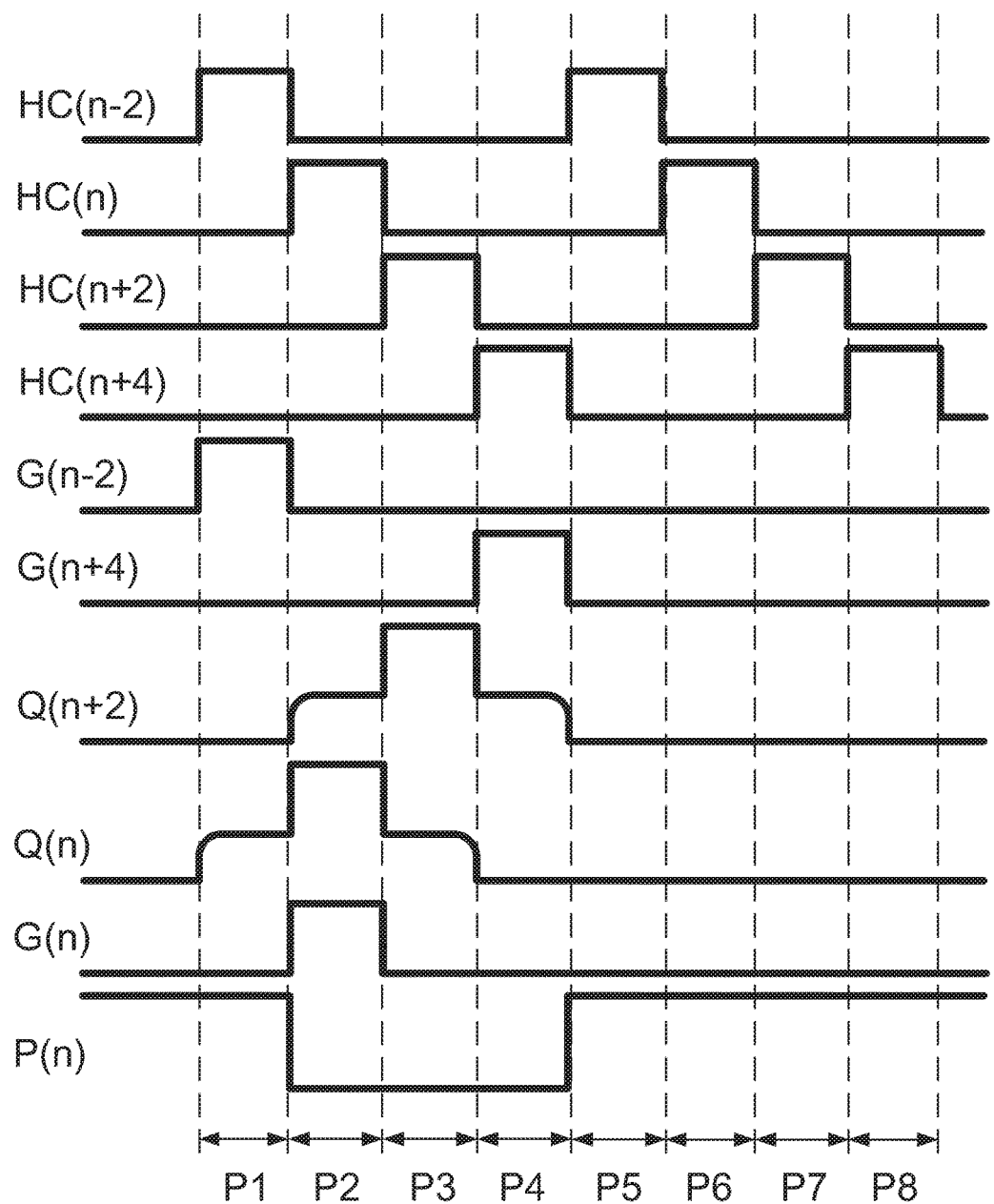
FIG. 2 is schematic diagram showing a wave from for controlling in accordance with embodiments of the present invention.

In operation, the driving circuit 110 is configured to generate a driving signal Q(n) and the scan signal G(n) in accordance with the control voltage on the node Q. To facilitate the understanding of the operation of the shift register 100, reference is made to FIG. 2. FIG. 2 is schematic diagram showing a wave from for controlling in accordance with embodiments of the present invention. During a pull-up period P1, the control circuit outputs the control signal P(n) having a high level in accordance with the high frequency clock signal HC(n−2) having a high level, and thus the switching circuit 130 can pull up the control voltage on the node Q of the driving circuit 110 in accordance with the control signal P(n) and the scan signal G(n−2) of the front 2-stage shift register accordingly. It can be understood that the switch circuit 130 conducts a function of a pull-up circuit during the pull-up period P1 to pull up the driving signal Q(n).

During a voltage-regulating period P5, the control circuit 120 outputs the control signal P(n) having a high level again, and thus the switching circuit 130 can regulate the voltage of the driving signal Q(n) and the voltage of the scan signal G(n) in accordance with the control signal P(n) and the scan signal G(n−2) of the front 2-stage shift register accordingly. At this time, the control signal P(n) is in a state of high level, and thus the switches T6, T7 are turned on accordingly to enable the driving signal Q(n) and the scan signal G(n) are still to be maintained in a state of low level. It can be understood that the switching circuit 130 conducts a function of a voltage-regulating circuit during the voltage-regulating period P5.

Therefore, the control circuit 120 of the embodiment of the present invention can accommodatingly control the switching circuit 130 to enable the switching circuit 130 to respectively conduct the function of the pull-up circuit and the function of the voltage-regulating circuit during different periods (such as the periods P1 and P5).

In other words, the switching circuit 130 of the embodiment of the present invention only needs a single circuit to integrate the pull-up circuit and the voltage-regulating circuit of a conventional shift register, and thus the shift register 100 of the embodiment of the present invention can decrease a number of circuits in the shift register 100 and save space in the shift register 100 accordingly to benefit fabrication of panels having a thinner size and panels having a slim boarder.

Further, the conventional shift register needs the pull-up circuit and the voltage-regulating circuit to respectively conduct corresponding functions, and such design results in an increase of a number of leakage paths of the driving signal besides an increase of a layout space of a whole circuit of the conventional shift register. The switching circuit 130 of the embodiment of the present invention integrates the pull-up circuit and the voltage-regulating circuit, and it is equivalent to remove a conventional pull-up control circuit from the shift register. Therefore, the switching circuit 130 not only saves the layout space of the circuits, but also decreases the number of the leakage paths of the driving signal, thereby enabling the shift register to have a better driving ability.

To facilitate the understanding of a whole operation flow of the shift register 100, reference is made to FIGS. 3A to 3D. FIGS. 3A to 3D are schematic diagrams showing operation of the shift register in the embodiment shown in FIG. 1.

Figure 3A:
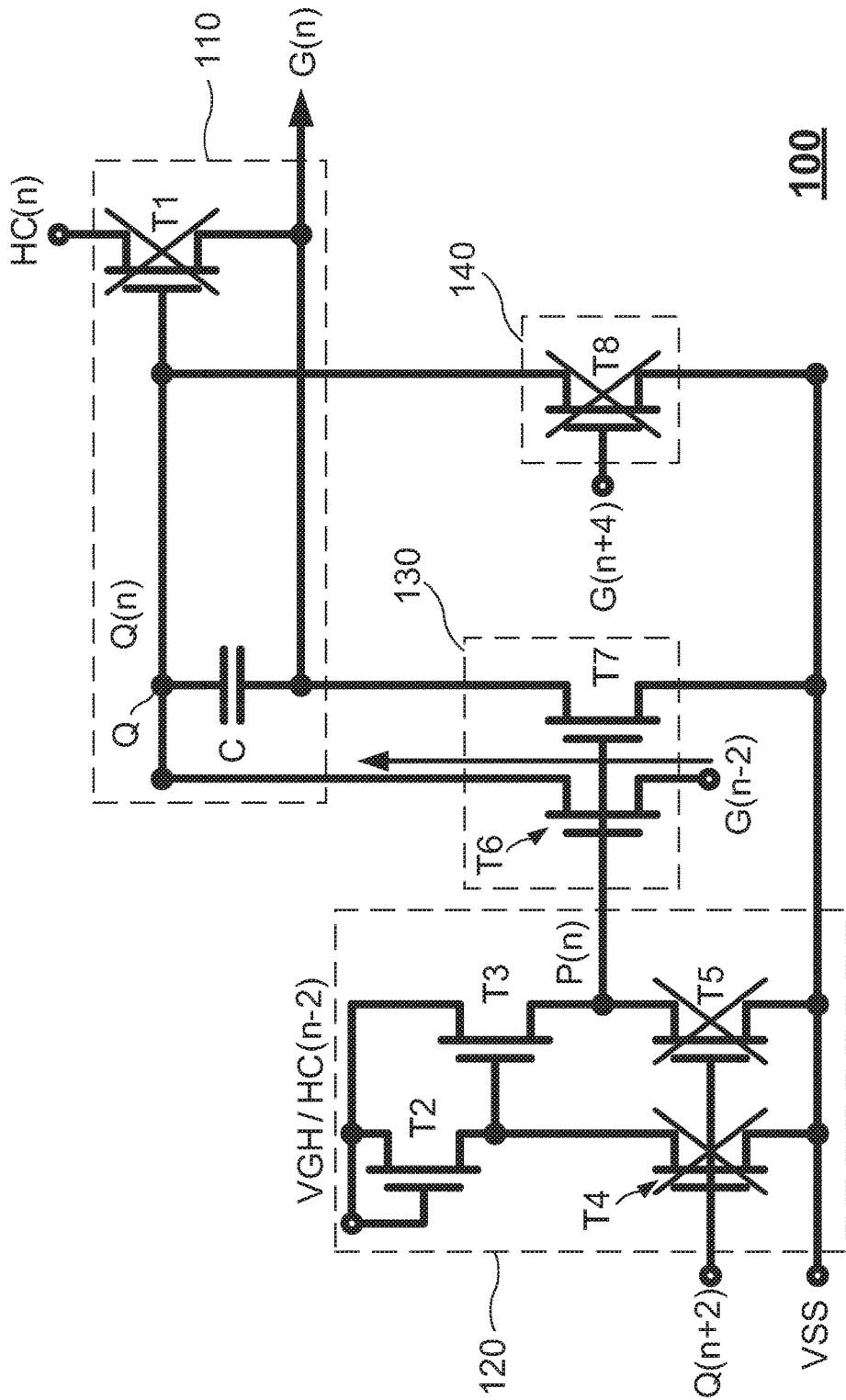
FIG. 3A is a schematic diagrams showing operation of the shift register in the embodiment shown in FIG. 1.

Referring to both of FIG. 2 and FIG. 3A, during the pull-up period P1, the driving signal Q(n+2) outputted by the rear stage shift register is a low level signal, the front stage high frequency clock signal HC(n−2) is a high level signal, and the front stage scan signal G(n−2) outputted by the front stage shift register is a high level signal. The pull-down unit of the control circuit 120 (such as the circuit constructed by the switches T4, T5) is turned off in accordance with the rear stage driving signal Q(n+2). The pull-up unit (such as the circuit constructed by the switches T2, T3) outputs the control signal P(n) having a high level in accordance with the front stage high frequency clock signal HC(n−2). The switching circuit 130 is turned on in accordance with the control signal P(n) having a high level and charges the driving circuit 110 by using the front stage scan signal G(n−2) having a high level to pull up the control voltage on the node Q of the driving circuit 100, thereby pulling up a level of the driving signal Q(n). However, at this time, the level of the driving signal Q(n) is not enough to turn on the first switch T1, and thus the scan signal G(n) is still maintained in a low level. In addition, the switch T8 of the pull-down circuit 140 is also turned off in accordance with the rear stage scan signal G(n+4) having a low level.

Figure 3B:
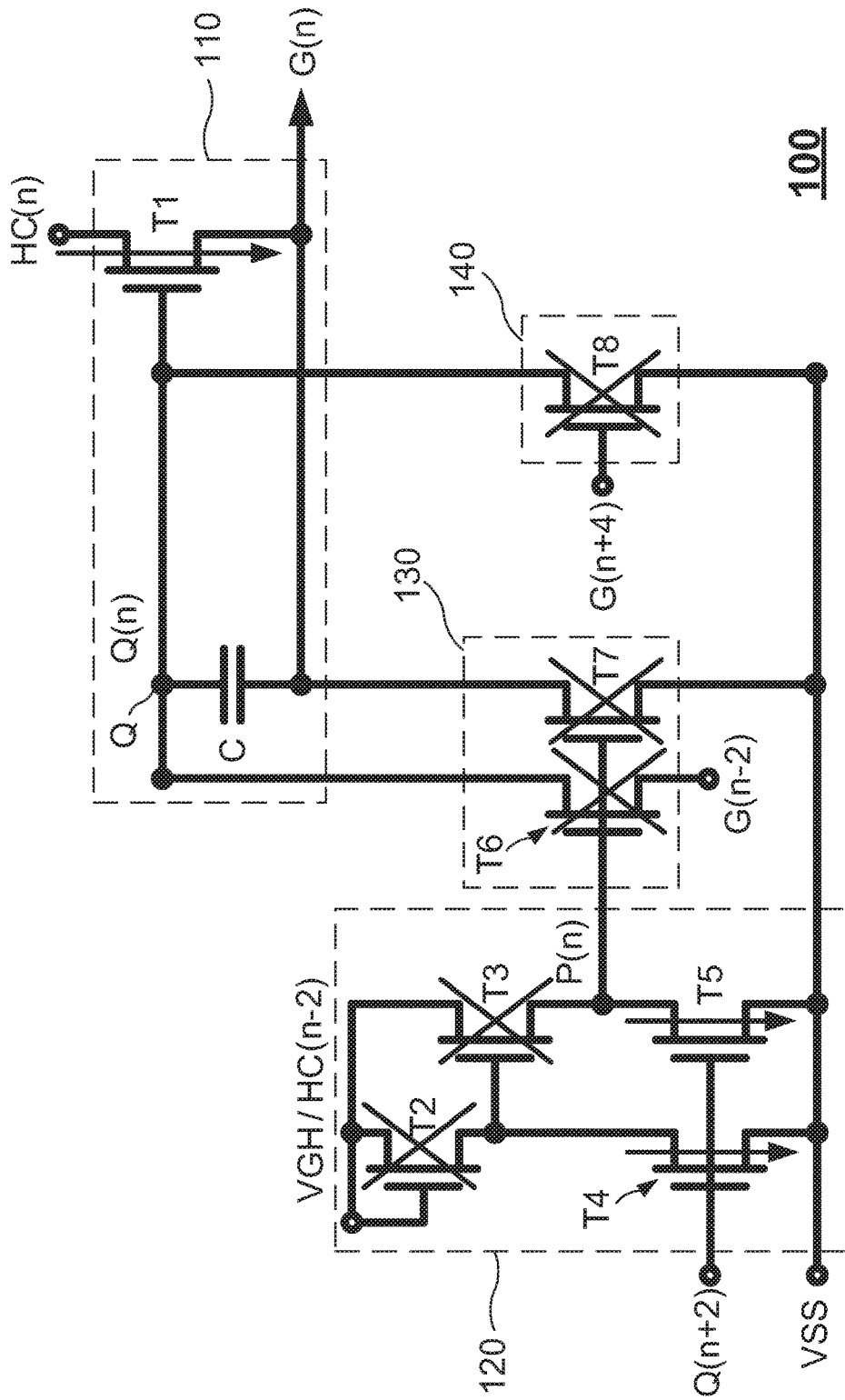
FIG. 3B is a schematic diagrams showing operation of the shift register in the embodiment shown in FIG. 1.

Referring to both of FIG. 2 and FIG. 3B, during the driving period P2, the high frequency clock signal HC(n−2) is turned into a low level signal, and the rear stage driving signal Q(n+2) is turned into a high level signal. The pull-up unit (such as the circuit constructed by the switch T2 and the switch T3) of the control circuit 120 is turned off in accordance with the high frequency clock signal HC(n−2) having a low level. The pull-down unit (such as the circuit constructed by a switch T4 and a switch T5) of the control circuit 120 is turned on in accordance with the rear stage driving signal Q(n+2) having a high level to pull down the level of the control signal P(n) for outputting the control signal P(n) having a low level. The switching circuit 130 is turned off in accordance with the control signal P(n) having a low level. At this time, the scan signal G(n) conducts a coupling operation to the node Q of the driving circuit 110 through the capacitor C to pull up the driving signal Q(n) on the node Q again, thereby turning on the first switch T1, and the first switch T1 outputs the scan signal G(n) in accordance with the high frequency clock signal HC(n). At this time, the switch T8 of the pull-down circuit 140 is still maintained in an off state in accordance with the rear stage scan signal G(n+4) having a low level.

Figure 3C:
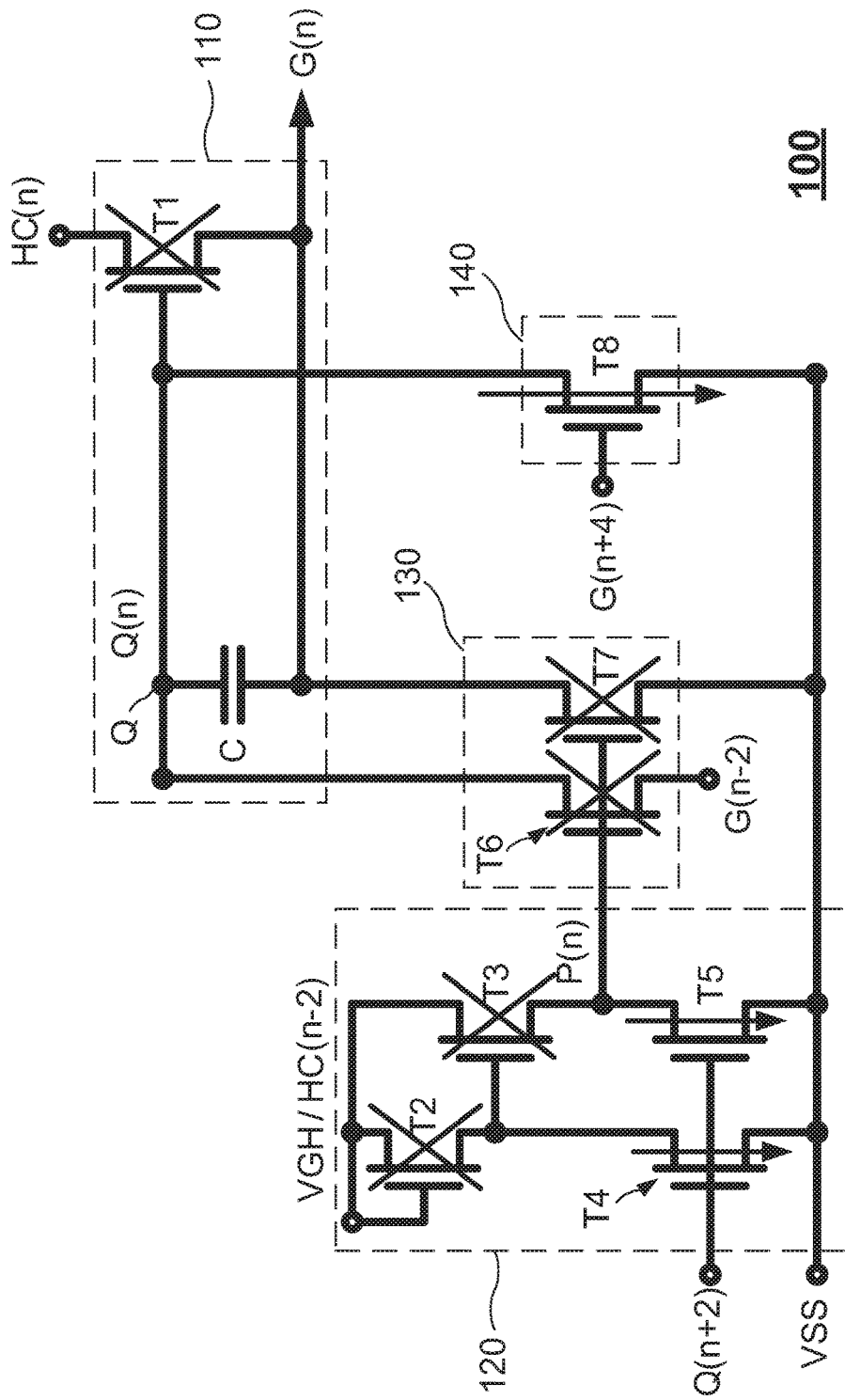
FIG. 3C is a schematic diagrams showing operation of the shift register in the embodiment shown in FIG. 1.

Referring to both of FIG. 2 and FIG. 3C, during the pull-down period P4, the rear stage scan signal G(n+4) outputted by the rear stage shift register is a high level signal, and the pull-down circuit 140 (such as the switch T8) is turned on in accordance with the rear stage scan signal G(n+4) having a high level, thereby grounding the node Q of the driving circuit 110 to pull down the control voltage of the node Q, and then the driving signal Q(n) is pulled down to a state of a low level.

Figure 3D:
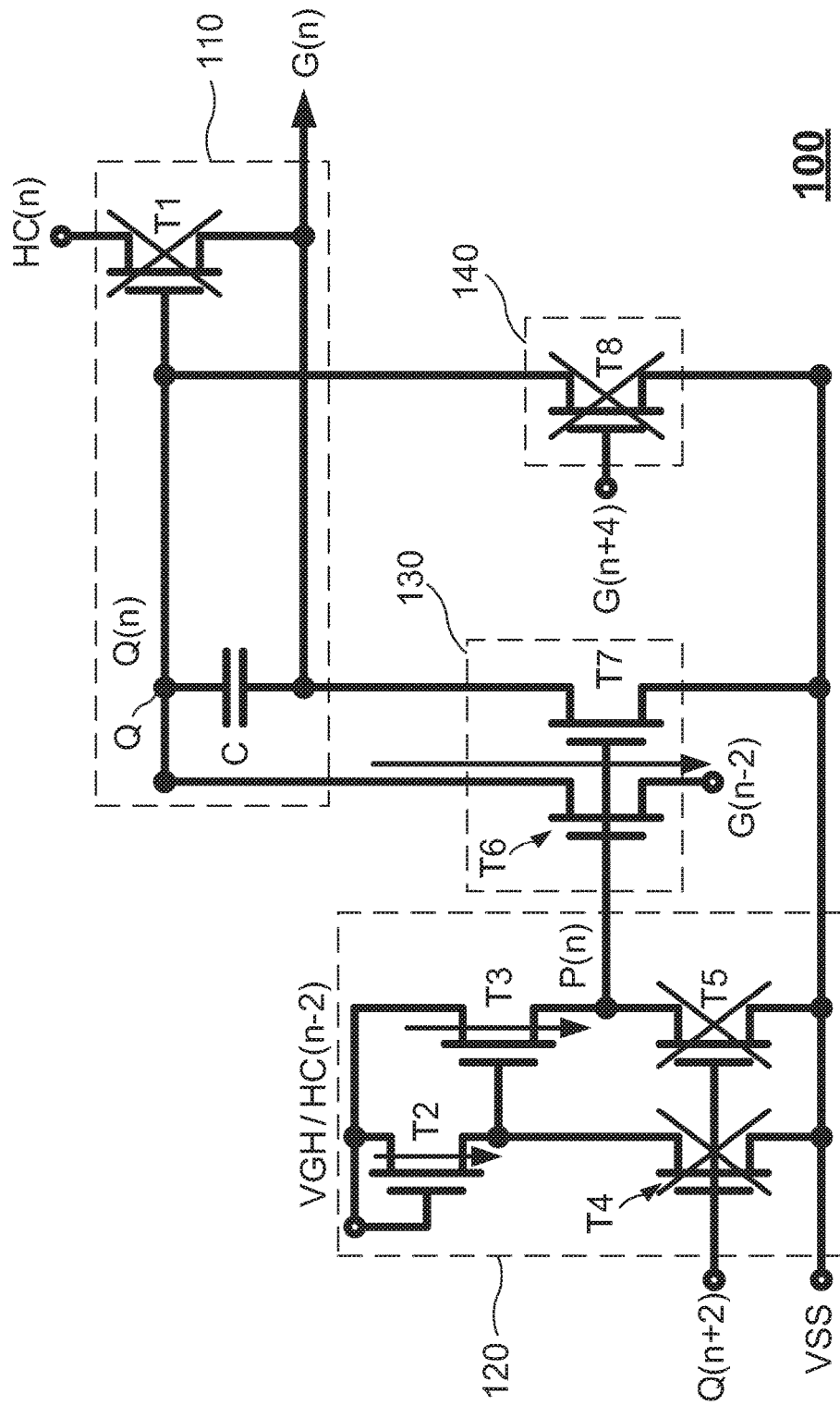
FIG. 3D is a schematic diagrams showing operation of the shift register in the embodiment shown in FIG. 1.

Referring to both of FIG. 2 and FIG. 3D, during the voltage-regulating period P5, the rear stage driving signal Q(n+2) is a low level signal, the front stage high frequency clock signal HC(n−2) is a high level signal, and the front stage scan signal G(n−2) is a low level signal. The pull-down unit (such as the circuit constructed by the switch T4 and the switch T5) of the control circuit 120 is turned off in accordance with the rear stage driving signal Q(n+2) having a low level. The pull-up unit (such as the circuit constructed by the switch T2, and the switch T3) of the control circuit 120 outputs the control signal P(n) having a high level in accordance with the front stage high frequency clock signal HC(n−2) having a high level. The switches T6, T7 of the switching circuit 130 are turned on in accordance with the control signal P(n) having a high level, thereby regulating the voltage of the driving signal Q(n) and the voltage of the scan signal G(n) by using the front stage scan signal G(n−2) having a low level and the low level signal VSS to enable the driving signal Q(n) and the scan signal G(n) to be maintained in a state of a low level.

Figure 4:
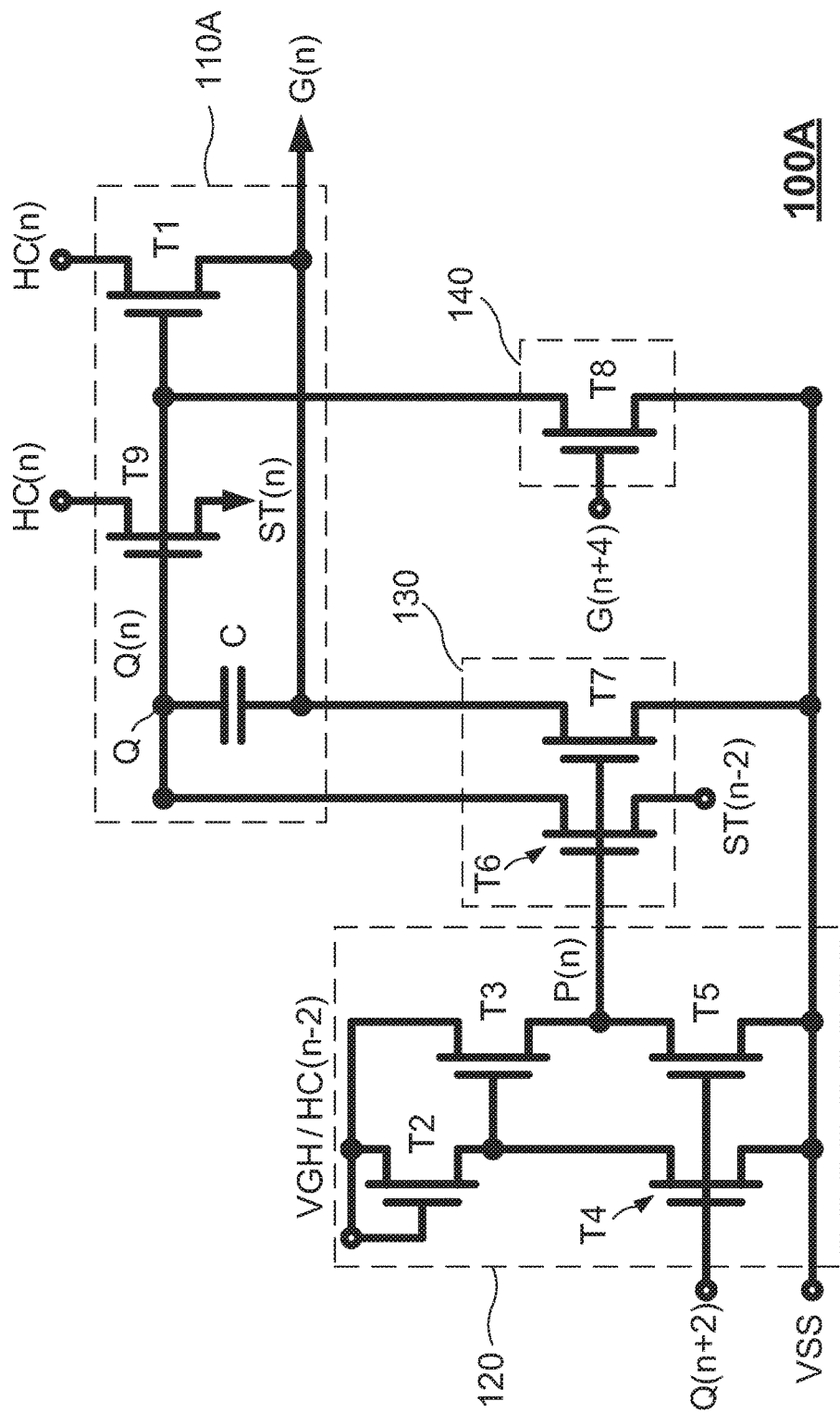
FIG. 4 is a schematic diagram showing a shift register in accordance with embodiments of the present invention.

FIG. 4 is a schematic diagram showing a shift register in accordance with another embodiment of the present invention. Comparing with the shift register 100 shown in FIG. 1, a driving circuit 110A of the shift register 100A further includes a second switch T9, and the second switch T9 includes a first terminal, a control terminal and a second terminal. The first terminal of the second switch T9 is configured to receive the high frequency clock signal HC(n), the control terminal is coupled to a terminal (node Q) of the capacitor C, and the second terminal is configured to output an actuating signal ST(n). In this embodiment, during the pull-up period, the switching circuit 130 of the shift register 100A charges the driving circuit 110A by using a front stage actuating signal ST(n−2) having a high level to pull high the control voltage on the node Q of the driving circuit 110A, thereby pulling up the driving signal Q(n). A reason why the shift register 100 in FIG. 1 and the shift register 100A in FIG. 4 adopt different arrangements is described as below.

A property of the signal received by the switching circuit 130 of the shift register 100 in FIG. 1 is a scan signal (such as the front stage scan signal G(n−2)), and the scan signal is provided to an active area (AA) of a panel as well. Since RC loading of the active area is great, the scan signal may be influenced and an incomplete waveform of the scan signal is produced accordingly, thereby causing a degradation of the driving ability of the scan signal. Comparing with the shift register 100, the arrangement of the shift register 100A shown in FIG. 4 is advantageous in that a property of the signal received by the switching circuit 130 of the shift register 100A is an actuating signal (such as the front stage actuating signal ST(n−2)), and the actuating signal is a signal provided to inner circuits of the shift register 100A. Since RC loading of the inner circuits is small, the waveform of the actuating signal is more complete than that of the scan signal, and then the driving ability of the actuating signal is upgraded. Referring to FIG. 4, since the driving circuit 110A of the shift register 100A further includes the second switch T9, the driving circuit 110A is capable of providing the actuating signal ST(n) through the second terminal of the second switch T9. The actuating signal ST(n) is provided to the switching circuit 130 to upgrade the driving ability thereof.

Figure 5:
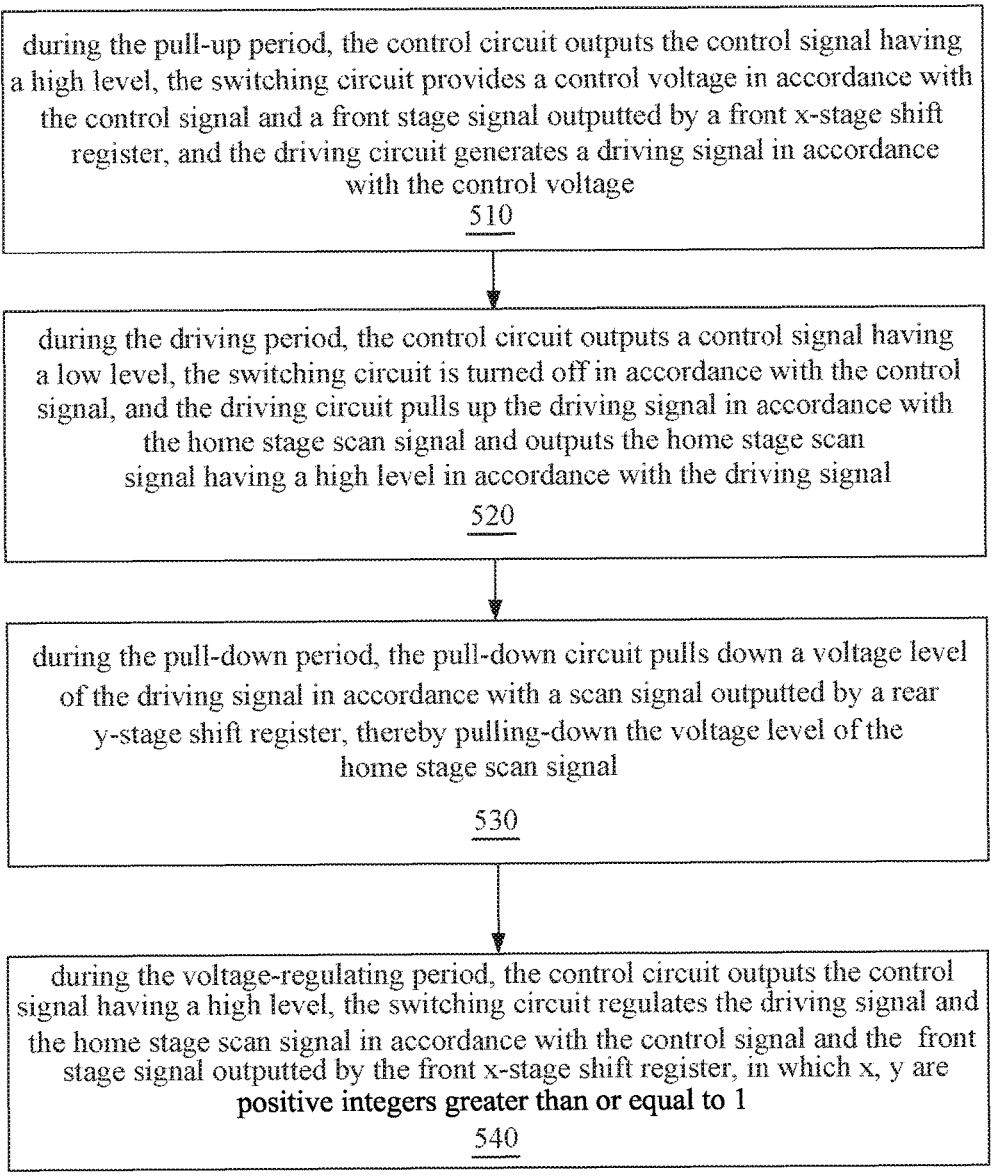
FIG. 5 is flow chart showing a control method of a shift register in accordance with embodiments of the present invention.

FIG. 5 is a flow chart showing a control method of a shift register in accordance with embodiments of the present invention. As shown in FIG. 5, the control method 500 of the shift register includes following steps:

Step 510: during the pull-up period, the control circuit outputs the control signal having a high level, the switching circuit provides a control voltage in accordance with the control signal and a front stage signal outputted by a front x-stage shift register, and the driving circuit generates a driving signal in accordance with the control voltage;

Step 520: during the driving period, the control circuit outputs a control signal having a low level, the switching circuit is turned off in accordance with the control signal, and the driving circuit pulls up the driving signal in accordance with the home stage scan signal and outputs the home stage scan signal having a high level in accordance with the driving signal;

Step 530: during the pull-down period, the pull-down circuit pulls down a voltage level of the driving signal in accordance with a scan signal outputted by a rear y-stage shift register, thereby pulling-down the voltage level of the home stage scan signal; and Step 540: during the voltage-regulating period, the control circuit outputs the control signal having a high level, the switching circuit regulates the driving signal and the home stage scan signal in accordance with the control signal and the front stage signal outputted by the front x-stage shift register, in which x, y are positive integers greater than or equal to 1.

Referring to both of FIG. 2 and FIG. 3A, in the step 510, during the pull-up period P1, the driving signal Q(n+2) outputted by the rear stage shift register is a low level signal, the front stage high frequency clock signal HC(n−2) is a high level signal, and the front stage scan signal G(n−2) outputted by the front stage shift register is a high level signal. The control circuit 120 can be used to output the control signal P(n) having a high level in accordance with the front stage high frequency clock signal HC(n−2). Thereafter, the switching circuit 130 provides the control voltage to the node Q in accordance with the control signal P(n) and the front stage scan signal G(n−2), and the driving circuit 110 generates the driving signal Q(n) in accordance with the control voltage.

In an embodiment, during the pull-up period P1, the switching circuit 130 is turned on in accordance with the control signal P(n) and charges the driving circuit 110 by using the front stage scan signal G(n−2) having a high level to pull up the control voltage on the node Q.

Referring to both of FIG. 2 and FIG. 3B, in the step 520, during the driving period P2, the high frequency clock signal HC(n−2) is turned into a low level signal, and the rear stage driving signal Q(n+2) is turned into a high level signal. The control circuit 120 can be used to output the control signal P(n) having a low level. Thereafter, the switching circuit 130 is turned off in accordance with the control signal P(n) having a low level. At this time, the scan signal G(n) conducts a coupling operation to the node Q of the driving circuit 110 through the capacitor C to pull up the driving signal Q(n) on the node Q again, thereby turning on the first switch T1, and the first switch T1 outputs the home stage scan signal G(n) having a high level in accordance with the high frequency clock signal HC(n).

In an embodiment, during the period P2, the control circuit 120 can be used to output the control signal P(n) having a low level in accordance with the driving signal Q(n+2) of the rear 2-stage shift register. However, the present invention is not limited to the driving signal Q(n+2) of the rear 2-stage shift register. When the present invention is practiced, a rear stage driving signal of a rear z-stage shift register can be used in accordance with actual demands, in which z is a positive integer greater than or equal to 1.

Referring to both of FIG. 2 and FIG. 3C, during the pull-down period P4, the rear stage scan signal G(n+4) outputted by the rear stage shift register is a high level signal, and the pull-down circuit 140 (such as the switch T8) is turned on in accordance with the rear stage scan signal G(n+4) having a high level, thereby grounding the node Q of the driving circuit 110 to pull down the control voltage of the node Q, and then the driving signal Q(n) is pulled down to a state of a low level. At this time, the driving circuit 110 outputs the scan signal G(n) having a low level.

In an embodiment, during the pull-down period P4, the pull-down 140 is turned on or turned off in accordance with the scan signal G(n+4) of the rear 4-stage shift register. However, the present invention is not limited to the scan signal G(n+4) of the rear 4-stage shift register. When the present invention is practiced, a rear stage scan signal outputted by a rear y-stage shift register can be used in accordance with actual demands, in which y is a positive integer greater than or equal to 1.

Referring to FIG. 2 and FIG. 3D, during the voltage-regulating period P5, the rear stage driving signal Q(n+2) is a low level signal, the front stage high frequency clock signal HC(n−2) is a high level signal, and the front stage scan signal G(n−2) is a low level signal. The control circuit 120 can be used to output the control signal P(n) having a high level in accordance with the front stage high frequency clock signal HC(n−2). Thereafter, the switching circuit 130 regulates the voltage of the driving signal Q(n) and the voltage of the scan signal G(n) in accordance with the control signal P(n) having a high level and the front stage scan signal G(n−2) or the front stage actuating signal ST(n−2).

In an embodiment, during the voltage-regulating period P5, the switching circuit 130 are turned on in accordance with the control signal P(n) having a high level, thereby respectively regulating the voltage of the driving signal Q(n) and the voltage of the scan signal G(n) by using the front stage scan signal G(n−2) having a low level or the front stage actuating signal ST(n−2) having a low level and the low level signal VSS to enable both of the driving signal Q(n) and the scan signal G(n) to be maintained in a state of a low level.

Further, as may be appreciated by persons having ordinary skill in the art, the steps of the control method 500 of the shift register are named according to the function they perform, and such naming is provided to facilitate the understanding of the present disclosure but not to limit the steps. Combining the step into a single step or dividing any one of the steps into multiple steps, or switching any step so as to be a part of another step falls within the scope of the embodiments of the present disclosure.

In view of the above embodiments of the present disclosure, it is apparent that the application of the present invention has a number of advantages. Embodiments of the present disclosure provide a shift register and a control method thereof, in which the switching circuit is accommodatingly controlled to respectively conduct the function of the pull-up circuit and the function of the voltage-regulating circuit during different periods, thereby decreasing a number of circuits in the shift register and saving space in the shift register 100 accordingly to benefit fabrication of panels having a thinner size and panels having a slim boarder. In addition, since the number of the inner circuits of the shift register is decreased, the number of leakage paths of the driving signal is also decreased, thereby enabling the shift register to have a better driving ability.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A shift register, comprising:
   a control circuit configured to output a control signal having a high level during a pull-up period and a voltage-regulating period respectively;
   a switching circuit coupled to the control circuit and configured to provide a control voltage in accordance with the control signal and a front stage signal outputted by a front x-stage shift register during the pull-up period;
   a driving circuit coupled to the switching circuit and configured to receive the control voltage provided by the switching circuit, and to output a home stage scan signal in accordance with the control voltage; and
   a pull-down circuit coupled to the driving circuit and configured to pull down a voltage level of the control voltage in accordance with a scan signal outputted by a rear y-stage shift register during a pull-down period;
   wherein the switching circuit is configured to regulate the home stage scan signal in accordance with the control signal and the front stage signal outputted by the front x-stage shift register during the voltage-regulating period, and x, y are positive integers greater than or equal to 1.

2. The shift register of claim 1, wherein the switching circuit is turned on in accordance with the control signal during the pull-up period, thereby charging the driving circuit by using the front stage signal having a high level to pull up a voltage level of the control voltage.

3. The shift register of claim 2, wherein the control circuit outputs the control signal having a low level during a driving period, and the switching circuit is turned off in accordance with the control signal.

4. The shift register of claim 3, wherein the driving circuit comprises:
   a capacitor configured to store the control voltage; and
   a first switch coupled to the capacitor and turned on in accordance with the control voltage during the driving period, so as to output the home stage scan signal in accordance with a high frequency clock signal.

5. The shift register of claim 4, wherein the driving circuit further comprises:
   a second switch comprising:
      a first terminal configured to receive the high frequency clock signal;
      a control terminal coupled to the capacitor and configured to receive the control voltage; and
      a second terminal configured to output an actuating signal.

6. The shift register of claim 1, wherein the pull-down circuit is turned on in accordance with the scan signal outputted by the rear y-stage shift register during the pull-down period, thereby grounding the driving circuit to pull down the voltage level of the control voltage.

7. The shift register of claim 4, wherein the switching circuit comprises a third switch comprising:
   a first terminal coupled to a terminal of the capacitor and configured to provide the control voltage;
   a control terminal coupled to the control circuit and configured to receive the control signal; and
   a second terminal configured to receive the front stage signal outputted by the front x-stage shift register, wherein the front stage signal is a front stage scan signal.

8. The shift register of claim 7, wherein the switching circuit further comprises a fourth switch comprising:
   a first terminal coupled to another terminal of the capacitor and an output terminal of the first switch;
   a control terminal coupled to the control circuit and configured to receive the control signal; and
   a second terminal coupled to a low voltage source.

9. The shift register of claim 5, wherein the switching circuit comprises a third switch comprising:
   a first terminal coupled to a terminal of the capacitor and configured to provide the control voltage;
   a control terminal coupled to the control circuit and configured to receive the control signal; and
   a second terminal configured to receive the front stage signal outputted by the front x-stage shift register, wherein the front stage signal is a front stage actuating signal.

10. The shift register of claim 9, wherein the switching circuit further comprises a fourth switch comprising:
    a first terminal coupled to another terminal of the capacitor and an output terminal of the first switch;
    a control terminal coupled to the control circuit and configured to receive the control signal; and
    a second terminal coupled to a low voltage source.

11. The shift register of claim 1, wherein the control circuit comprises:
    a pull-up unit configured to output the control signal having a high level in accordance with a front stage high frequency clock signal.

12. The shift register of claim 11, wherein the control circuit comprises:
    a pull-down unit configured to output the control signal having a low level in accordance with a rear stage driving signal of a rear z-stage shift register, wherein z is a positive integer greater than or equal to 1.

13. The shift register of claim 1, wherein the front stage signal comprises one of a front stage scan signal and a front stage actuating signal.

14. A control method of a shift register, wherein the shift register comprises a control circuit, a switching circuit, a driving circuit and a pull-down circuit, and the switching circuit is coupled between the control circuit and the driving circuit, and the pull-down circuit is coupled to the driving circuit, wherein the control method comprises:
    during a pull-up period, outputting a control signal having a high level by using the control circuit and providing a control voltage to the driving circuit by using the switching circuit in accordance with the control signal and a front stage signal outputted by a front x-stage shift register;
    during a driving period, outputting a home stage scan signal by using the driving circuit in accordance with the control voltage;
    during a pull-down period, pulling down a voltage level of the control voltage by using the pull-down circuit in accordance with a scan signal outputted by a rear y-stage shift register; and
    during a voltage-regulating period, outputting the control signal having a high level by using the control circuit and regulating the home stage scan signal by using the switching circuit in accordance with the control signal and the front stage signal outputted by the front x-stage shift register, and x, y are positive integers greater than or equal to 1.

15. The control method of claim 14, wherein during the pull-up period, the step of providing the control voltage by using the switching circuit in accordance with the control signal and the front stage signal outputted by the front x-stage shift register comprises:

during the pull-up period, charging the driving circuit by using the switching circuit in accordance with the control signal and the front stage signal to pull up a voltage level of the control voltage.

16. The control method of claim 14, wherein during the pull-down period and the voltage-regulating period, the step of outputting the control signal having a high level by using the control circuit comprises:

during the pull-up period and the voltage-regulating period, outputting the control signal having a high level by using the control circuit in accordance with a front stage high frequency clock signal.

17. The control method of claim 14, wherein during the pull-down period, the step of pulling down the voltage level of the control signal by using the pull-down circuit in accordance with the scan signal outputted by the rear y-stage shift register comprises:

during the pull-down period, grounding the driving circuit by using the pull-down circuit in accordance with the scan signal outputted by the rear y-stage shift register to pull down the voltage level of the control signal.

18. The control method of claim 14, further comprising:

during the driving period, pulling up the control signal by using the driving circuit in accordance with the home stage scan signal.

19. The control method of claim 18, wherein the step of pulling up the control signal comprises using capacitive coupling to pull up the control signal.

20. The control method of claim 14, wherein the step of regulating the home stage scan signal by using the switching circuit in accordance with the control signal and the front stage signal outputted by the front x-stage shift register during the voltage-regulating period comprises:

during the voltage-regulating period, regulating the home stage scan signal by using the switching circuit in accordance with the control signal having a high level and a front stage scan signal having a low level.

* * * * *